United States Patent
Lee et al.

(10) Patent No.: US 11,974,450 B2
(45) Date of Patent: Apr. 30, 2024

(54) DISPLAY PANEL

(71) Applicant: SAMSUNG DISPLAY CO., LTD., Yongin-si (KR)

(72) Inventors: Seungjae Lee, Yongin-si (KR); Hyesoo Jee, Yongin-si (KR); Wongeun Lee, Yongin-si (KR); Hansoo Kim, Yongin-si (KR); Kyungmin Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/136,743

(22) Filed: Dec. 29, 2020

(65) Prior Publication Data

US 2021/0202894 A1 Jul. 1, 2021

(30) Foreign Application Priority Data

Dec. 31, 2019 (KR) .................. 10-2019-0179807

(51) Int. Cl.
*H10K 50/842* (2023.01)
*H10K 59/122* (2023.01)

(52) U.S. Cl.
CPC ....... *H10K 50/8423* (2023.02); *H10K 59/122* (2023.02)

(58) Field of Classification Search
None
See application file for complete search history.

(56) References Cited

U.S. PATENT DOCUMENTS

| | | | |
|---|---|---|---|
| 8,304,989 B2 | 11/2012 | Song et al. | |
| 9,496,320 B2 | 11/2016 | Hong et al. | |
| 9,825,253 B2 | 11/2017 | Cho et al. | |
| 9,877,382 B2 | 1/2018 | Lee | |
| 10,109,649 B2 | 10/2018 | Jang | |
| 10,497,768 B2 | 12/2019 | Jang | |
| 2005/0046346 A1* | 3/2005 | Tsuchiya | H10K 59/131 313/503 |
| 2005/0218396 A1* | 10/2005 | Tsuchiya | H01L 27/3246 257/13 |
| 2007/0170850 A1* | 7/2007 | Choi | H01L 51/5246 313/506 |
| 2009/0051286 A1* | 2/2009 | Yamazaki | H01L 51/5246 257/E23.138 |
| 2014/0183458 A1* | 7/2014 | Lee | H01L 51/5246 438/46 |

(Continued)

FOREIGN PATENT DOCUMENTS

| | | |
|---|---|---|
| KR | 10-0470271 B1 | 5/2005 |
| KR | 10-2010-0009059 | 1/2010 |

(Continued)

*Primary Examiner* — Khaja Ahmad
(74) *Attorney, Agent, or Firm* — Lewis Roca Rothgerber Christie LLP

(57) ABSTRACT

The present disclosure provides a display panel including a first substrate, pixels arranged on the first substrate and configured to define a display area, a second substrate facing the first substrate, an insulating layer on the first substrate and including an edge that is closer to the display area than an edge of the first substrate, a conductive layer on the insulating layer, and a sealing member between the first substrate and the second substrate and surrounding the display area.

17 Claims, 7 Drawing Sheets

(56) References Cited

U.S. PATENT DOCUMENTS

| | | | |
|---|---|---|---|
| 2015/0001501 A1* | 1/2015 | Cho | H10K 59/12 257/40 |
| 2015/0108438 A1* | 4/2015 | Kim | H10K 50/8426 257/40 |
| 2016/0111478 A1* | 4/2016 | Hong | H01L 27/3276 257/40 |
| 2016/0293883 A1* | 10/2016 | Hong | H01L 51/5246 |
| 2016/0343792 A1* | 11/2016 | Jang | H01L 27/3276 |
| 2017/0288003 A1* | 10/2017 | Kim | H01L 27/3262 |

FOREIGN PATENT DOCUMENTS

| | | |
|---|---|---|
| KR | 10-2015-0094841 A | 8/2015 |
| KR | 10-2016-0046072 | 4/2016 |
| KR | 10-2016-0136517 | 11/2016 |
| KR | 10-2017-0031850 A | 3/2017 |
| KR | 10-2018-0107055 A | 10/2018 |

* cited by examiner

DISPLAY PANEL

CROSS-REFERENCE TO RELATED APPLICATION

This application claims priority to, and the benefit of, Korean Patent Application No. 10-2019-0179807, filed on Dec. 31, 2019, in the Korean Intellectual Property Office, the disclosure of which is incorporated by reference herein in its entirety.

BACKGROUND

1. Field

The present disclosure relates to a display panel in which damage by static electricity may decrease.

2. Description of Related Art

In general, a display device may be manufactured by forming organic light-emitting diodes on a lower substrate and coupling the lower substrate to an upper substrate to make the organic light-emitting diodes arranged inside the display device. An organic light-emitting display device may be used as a display of a relatively small product, such as a mobile phone, or may be used as a display of a large-sized product, such as a television.

In the case of the organic light-emitting display device, a sealing member may be used to couple the lower substrate and the upper substrate to each other, and may be arranged in a peripheral area. In the peripheral area, wires for displaying images, a circuit of a device, a thin inorganic layer, and the like also may be arranged in addition to the sealing member.

SUMMARY

When static electricity is applied to a display panel, problems such as damage to a layer (or layers) included in a display panel, or exfoliation of a sealing member, may occur. The present disclosure provides solutions to problems including the aforementioned problems, and discloses a display panel in which the likelihood of damage due to static electricity, etc. decreases. However, this is merely an example, and the scope of the disclosure is not limited thereto.

Additional aspects will be set forth in part in the description that follows and, in part, will be apparent from the description, or may be learned by practice of the presented embodiments of the disclosure.

According to one or more embodiments, a display panel includes a first substrate, pixels arranged on the first substrate and configured to define a display area, a second substrate facing the first substrate, an insulating layer on the first substrate and including an edge that is closer to the display area than an edge of the first substrate, a conductive layer on the insulating layer, and a sealing member between the first substrate and the second substrate and surrounding the display area.

The sealing member may directly contact the first substrate.

The sealing member may include an outer side surface and an inner side surface, wherein the edge of the insulating layer is between the outer side surface and the inner side surface of the sealing member in a plan view.

At least a portion of the conductive layer may overlap the sealing member.

A portion of the conductive layer may directly contact the sealing member.

Each of the pixels may include a pixel electrode, an emission layer on the pixel electrode, and an opposite electrode on the emission layer and electrically connected to the conductive layer.

The sealing member may include $SiO_2$.

The insulating layer may include an inorganic insulating layer.

The conductive layer may cover a side surface corresponding to the edge of the insulating layer.

An edge of the conductive layer may extend towards the edge of the first substrate past the edge of the insulating layer.

The insulating layer may include sub-layers forming a step difference.

The display panel may further include a thin film transistor electrically connected to one of the pixels and including a semiconductor layer and a gate electrode, wherein the insulating layer includes a first sub-layer on the semiconductor layer and a second sub-layer on the gate electrode.

According to one or more embodiments, a display panel includes a first substrate, pixels arranged on the first substrate, defining a display area, and each including a pixel electrode, an emission layer, and an opposite electrode, a second substrate facing the first substrate, an insulating layer on the first substrate, a conductive layer on the insulating layer, and electrically connected to the opposite electrode, and a sealing member between the first substrate and the second substrate, surrounding the display area, and including an inner side surface facing the display area, and an outer side surface that is opposite to the inner side surface, wherein an edge of the insulating layer and an edge of the conductive layer are between the inner side surface and the outer side surface of the sealing member in a plan view.

The sealing member may directly contact the first substrate.

The sealing member may include $SiO_2$.

The insulating layer may include an inorganic insulating layer.

The conductive layer may cover a side surface corresponding to the edge of the insulating layer.

The edge of the conductive layer may extend towards an edge of the first substrate past the edge of the insulating layer.

The insulating layer may include sub-layers forming a step difference.

The display panel may further include a thin film transistor electrically connected to one of the pixels, and including a semiconductor layer and a gate electrode, wherein the insulating layer includes a first sub-layer on the semiconductor layer and a second sub-layer on the gate electrode.

In addition to the aforesaid details, other aspects, features, and advantages will be clarified from the detailed description, claims, and drawings.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1:
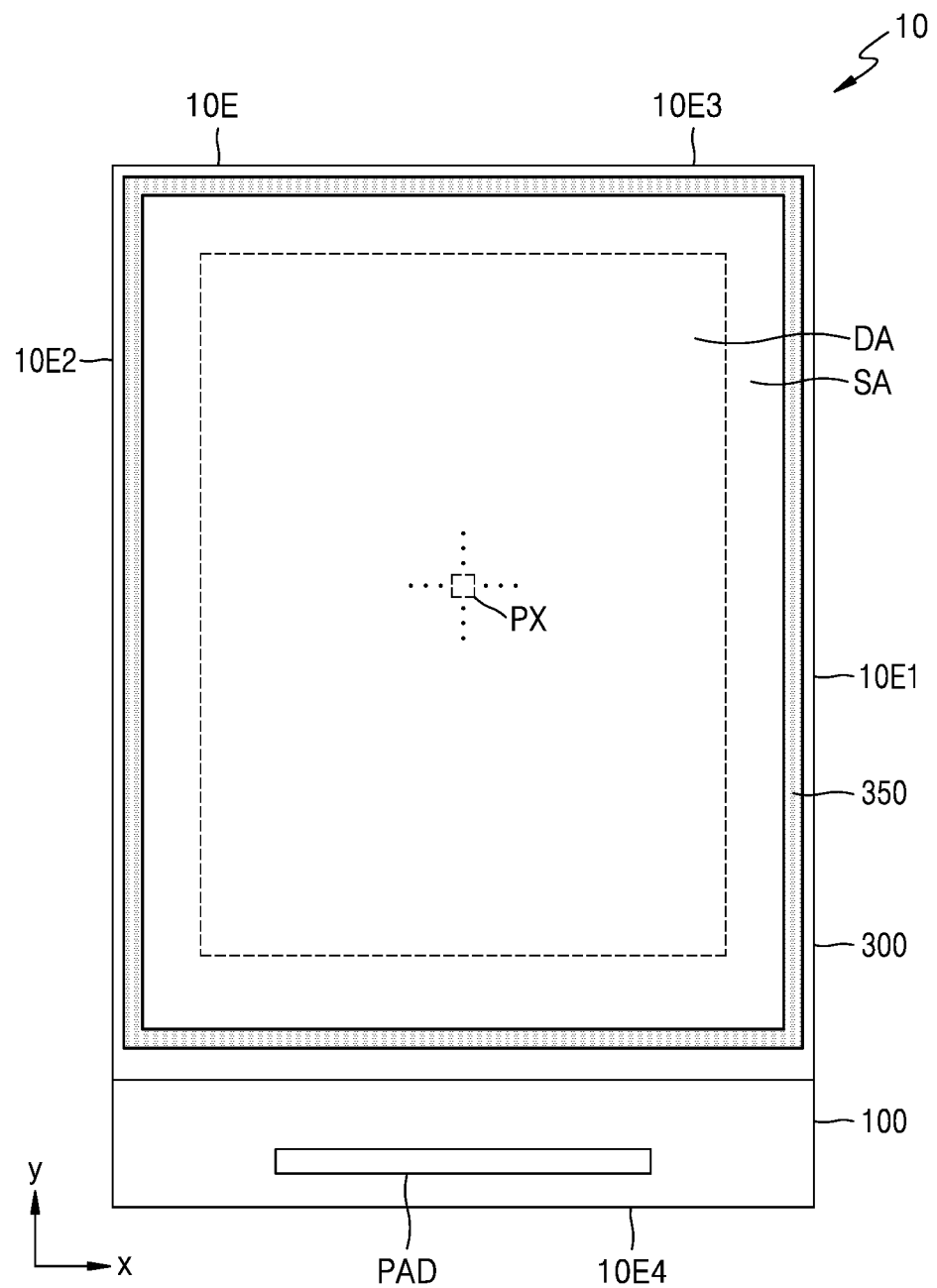
FIG. 1 is a schematic plan view of a display panel according to some embodiments, and illustrates an arrangement of a sealing member included in the display panel.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled"

refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic plan view of a display panel 10 according to some embodiments, and illustrates an arrangement of a sealing member included in a display panel.

Referring to FIG. 1, the display panel 10 may include a display area DA and a surrounding area SA. The display panel 10 may provide an image by using light emitted from emission elements respectively included in pixels PX arranged in the display area DA. That is, the display area DA may be defined by the pixels PX. The surrounding area SA is an area where no pixels PX are arranged, and may surround the display area DA.

Each of the pixels PX arranged in the display area DA may include an emission element, such as an organic light-emitting diode OLED. Each pixel PX may emit light of, for example, red, green, blue, and/or white from the organic light-emitting diode OLED. In the present specification, as described above, the pixel PX may be a sub-pixel emitting any one of red, green, blue, and white light.

Hereinafter, a case where the display panel 10 according to some embodiments includes an organic light-emitting display panel is described, but the display panel 10 is not limited thereto. In other embodiments, the display panel 10 may be a display panel such as an inorganic light-emitting display panel or a quantum dot light-emitting display panel. For example, an emission layer of a display element of the display panel 10 may include organic materials, inorganic materials, or quantum dots, or both organic materials and quantum dots, or both inorganic materials and quantum dots.

The display panel 10 may include edges 10E. In some embodiments, referring to FIG. 1, the display panel 10 may include a first edge 10E1 and a second edge 10E2, which are parallel to each other, and a third edge 10E3 and a fourth edge 10E4, which are parallel to each other and which couple the first edge 10E1 and the second edge 10E2 to each other. The first edge 10E1 and the second edge 10E2 may be relatively longer than the third edge 10E3 and the fourth edge 10E4. In other embodiments, the display panel 10 may include three, five, or more edges 10E and corners located between neighboring edges 10E. Further, the corners may be rounded in other embodiments, unlike the illustration of FIG. 1.

The display panel 10 may include a first substrate 100 and a second substrate 300, which overlap each other, and a sealing member 350 located between the first substrate 100 and the second substrate 300. The first substrate 100 and the second substrate 300 may face each other. FIG. 1 illustrates that the first substrate 100 and the second substrate 300 overlap each other.

The sealing member 350 may be arranged in the surrounding area SA, and may extend along edges of the display area DA to surround the display area DA.

The first substrate 100 may include a pad portion PAD arranged in the surrounding area SA. The pad portion PAD might not be covered by the second substrate 300. The pad portion PAD may be connected to lines (e.g., a data line, a driving power line, etc. described below with reference to FIG. 3), which pass through the display area DA, via wires. On the pad portion PAD, a driver IC including a data driver may be located, or an end portion of a flexible printed circuit board, on which the data driver is mounted, may be located. The driver IC may be electrically connected to the pad portion PAD through an anisotropic conductive film located between the driver IC and the pad portion PAD. The flexible printed circuit board may be electrically connected to the pad portion PAD through various types of conductive members.

Figure 2:
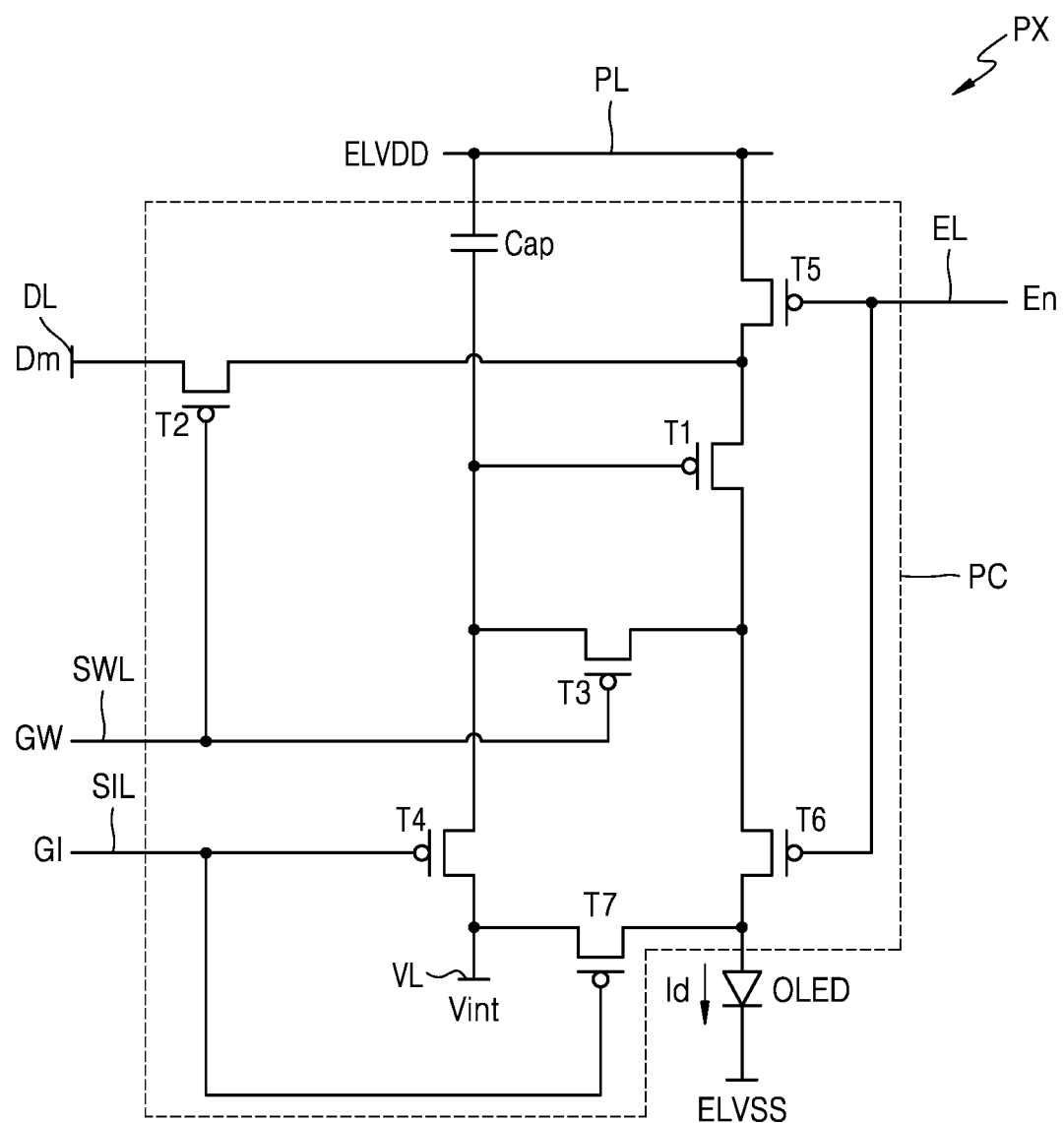
FIG. 2 is an equivalent circuit diagram of a pixel included in a display panel, according to some embodiments.

FIG. 2 is an equivalent circuit diagram of a pixel included in a display panel, according to some embodiments.

Referring to FIG. 2, one pixel PX includes a pixel circuit PC that includes thin film transistors T1 to T7 and a storage capacitor Cap. The pixel PX may include, as an emission element, the organic light-emitting diode OLED that emits light by receiving a driving voltage, or driving current Id, through the pixel circuit PC.

The pixel circuit PC may include thin film transistors and a storage capacitor. According to some embodiments, as illustrated in FIG. 2, the thin film transistors may include a driving thin film transistor T1, a switching thin film transistor T2, a compensation thin film transistor T3, a first initialization thin film transistor T4, a driving control thin film transistor T5, an emission control thin film transistor T6, and a second initialization thin film transistor T7.

A gate electrode of the driving thin film transistor T1 is connected to an electrode of the storage capacitor Cap, one of a source electrode and a drain electrode of the driving thin film transistor T1 is connected to a driving power line PL via the driving control thin film transistor T5, and the other of the source electrode and the drain electrode of the driving thin film transistor T1 is electrically connected to a pixel electrode of the organic light-emitting diode OLED via the emission control thin film transistor T6. The driving thin film transistor T1 is configured to receive a data signal Dm according to a switching operation of the switching thin film transistor T2, and is configured to supply the driving current Id to the organic light-emitting diode OLED.

A gate electrode of the switching thin film transistor T2 is connected to a first scan line SWL, one of a source electrode and a drain electrode of the switching thin film transistor T2 is connected to a data line DL, and the other of the source electrode and the drain electrode of the switching thin film transistor T2 is connected to the driving thin film transistor T1 and to the driving power line PL via the driving control thin film transistor T5. The switching thin film transistor T2 is turned on in response to a scan signal GW, which is transmitted via the first scan line SWL, and is configured to perform a switching operation of delivering, to the driving thin film transistor T1, the data signal Dm transmitted to the data line DL.

A gate electrode of the compensation thin film transistor T3 is connected to a first scan line SWL, one of a source electrode and a drain electrode of the compensation thin film transistor T3 is connected to the driving thin film transistor T1 and to the pixel electrode of the organic light-emitting diode OLED via the emission control thin film transistor T6, and the other of the source electrode and the drain electrode of the compensation thin film transistor T3 is connected to an electrode of the storage capacitor Cap, to the first initialization thin film transistor T4, and to the gate electrode of the driving thin film transistor T1. The compensation thin film transistor T3 is turned on in response to the scan signal GW transmitted through the first scan line SWL, and diode-connects the driving thin film transistor T1 by electrically connecting a first gate electrode G1 of the driving thin film transistor T1 to one (for example, the drain electrode) of the source electrode and the drain electrode of the driving thin film transistor T1.

A gate electrode of the first initialization thin film transistor T4 is connected to a second scan line SIL, one of a source electrode and a drain electrode of the first initialization thin film transistor T4 is connected to the second initialization thin film transistor T7 and to an initialization voltage line VL, and the other of the source electrode and the drain electrode of the first initialization thin film transistor T4 is connected to the electrode of the storage capacitor Cap, to the compensation thin film transistor T3, and to the driving thin film transistor T1. The first initialization thin film transistor T4 is turned on in response to a previous scan signal GI transmitted through the second scan line SIL, and is configured to perform an initialization operation in which an initialization voltage Vint is delivered to the gate electrode of the driving thin film transistor T1 such that a voltage of the gate electrode of the driving thin film transistor T1 is initialized.

A gate electrode of the driving control thin film transistor T5 is connected to an emission control line EL, one of a source electrode and a drain electrode of the driving control thin film transistor T5 is connected to the driving power line PL, and the other of the source electrode and the drain electrode of the driving control thin film transistor T5 is connected to the driving thin film transistor T1 and to the switching thin film transistor T2.

A gate electrode of the emission control thin film transistor T6 is connected to the emission control line EL, one of a source electrode and a drain electrode of the emission control thin film transistor T6 is connected to the driving thin film transistor T1 and to the compensation thin film transistor T3, and the other of the source electrode and the drain electrode of the emission control thin film transistor T6 is electrically connected to the second initialization thin film transistor T7 and to the pixel electrode of the organic light-emitting diode OLED.

The driving control thin film transistor T5 and the emission control thin film transistor T6 are concurrently or substantially simultaneously turned on in response to the emission control signal En transmitted through the emission control line EL, and a driving voltage ELVDD is delivered to the organic light-emitting diode OLED. Thus, the driving current Id flows in the organic light-emitting diode OLED.

A gate electrode of the second initialization thin film transistor T7 is connected to the second scan line SIL, one of a source electrode and a drain electrode of the second initialization thin film transistor T7 is connected to the emission control thin film transistor T6 and to the pixel electrode of the organic light-emitting diode OLED, and the other of the source electrode and the drain electrode of the second initialization thin film transistor T7 is connected to the first initialization thin film transistor T4 and to the initialization voltage line VL. The second initialization thin film transistor T7 is turned on in response to the previous scan signal GI transmitted through the second scan line SIL, and initializes the pixel electrode of the organic light-emitting diode OLED.

FIG. 2 illustrates that the first initialization thin film transistor T4 and the second initialization thin film transistor T7 are connected to the second scan line SIL, but one or more embodiments are not limited thereto. In other embodiments, the first initialization thin film transistor T4 may be connected to the second scan line SIL and driven in response to the previous scan signal GI, and the second initialization thin film transistor T7 may be connected to a first scan line or to a second scan line of a pixel in a previous row of, or in a subsequent row of, the corresponding pixel PX.

One electrode of the storage capacitor Cap is connected to the driving power line PL, and an opposite electrode of the organic light-emitting diode OLED is connected to a common voltage ELVSS. Accordingly, the organic light-emitting diode OLED may emit light according to the driving current Id transmitted from the driving thin film transistor T1, and thus, an image may be displayed.

FIG. 2 illustrates that the pixel circuit PC includes seven thin film transistors T1 to T7 and one storage capacitor Cap, but one or more embodiments are not limited thereto. The number of thin film transistors and storage capacitors may vary according to a design of the pixel circuit PC.

Figure 3:
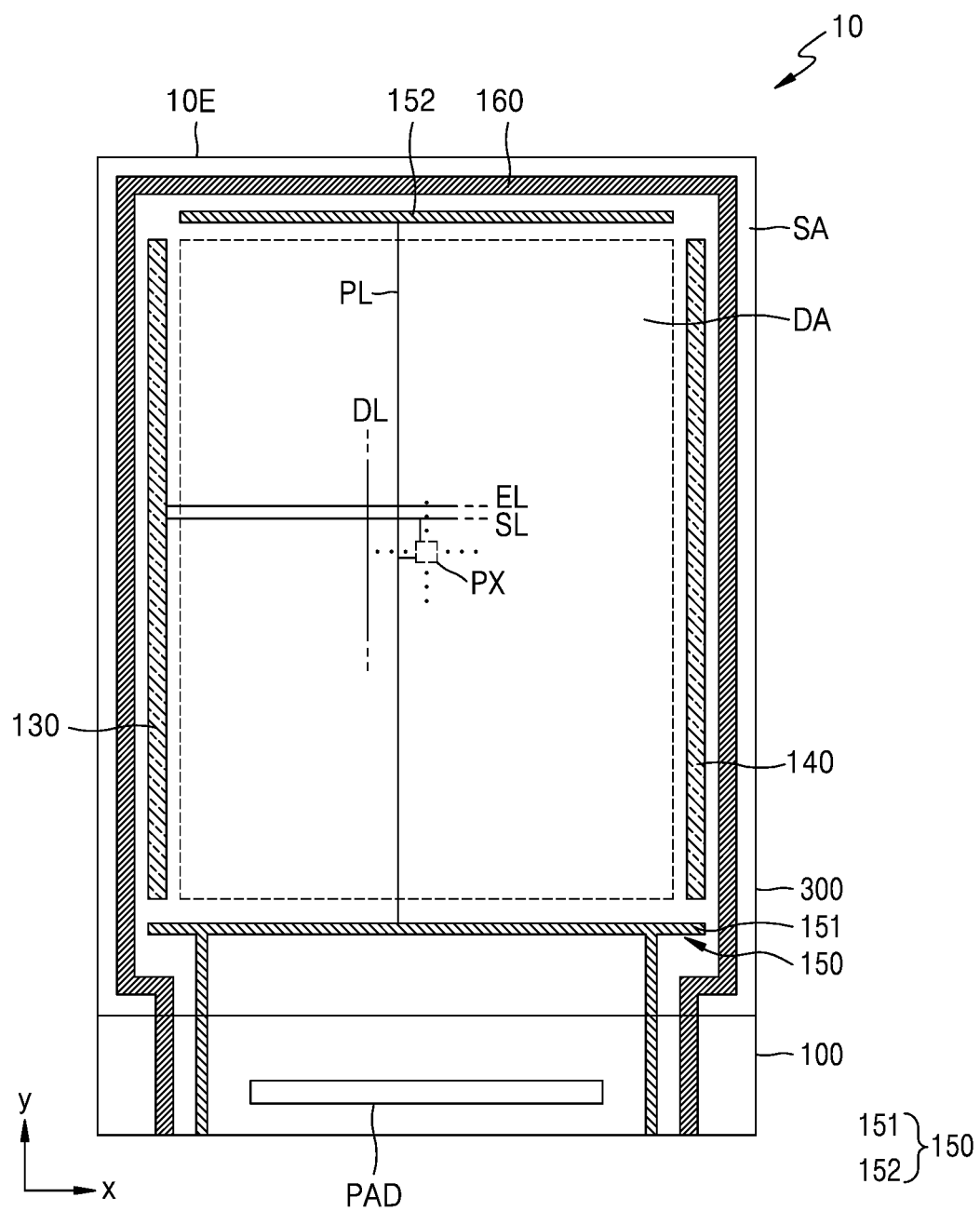
FIG. 3 is a schematic plan view of a display panel according to some embodiments, and illustrates an arrangement of a conductive layer included in a display panel.

FIG. 3 is a schematic plan view of a display panel according to some embodiments, and illustrates an arrangement of a conductive layer included in the display panel.

Each of the pixels PX arranged in the display area DA may be electrically connected to outer circuits that are arranged in the surrounding area SA. In the surrounding area SA, a first driver 130, a second driver 140, a first conductive layer 150, and a second conductive layer 160 may be arranged. The first driver 130 and the second driver 140 may each include a scan driver and/or an emission control driver.

The first driver 130 may transmit the scan signals (GW and GI of FIG. 2) to each pixel PX through a corresponding scan line SL. As described herein, the scan line SL may include the first scan line (SWL of FIG. 2) and the second scan line (SIL of FIG. 2). The first driver 130 may transmit the emission control signal (En of FIG. 2) to each pixel PX through a corresponding emission control line EL. The second driver 140 may be arranged in parallel with the first driver 130 with the display area DA therebetween. In some embodiments, some of the pixels PX may be electrically connected to the first driver 130, and others thereof may be connected to the second driver 140. In other embodiments, the second driver 140 may be omitted.

The driving voltage (ELVDD of FIG. 2) may be provided to each pixel PX through the driving power line PL connected to the first conductive layer 150, and the common voltage (ELVSS of FIG. 2) may be provided to an opposite electrode of each pixel PX connected to the second conductive layer 160. The first conductive layer 150 may include a first sub-conductive layer 151 and a second sub-conductive layer 152 that extend in parallel in an x direction with the display area DA therebetween. The second conductive layer 160 may have a loop shape of which one side is open, and may partially surround the display area DA.

A data driving circuit may be electrically connected to the data line DL. The data signal (Dm of FIG. 2) of the data driving circuit may be provided to each pixel PX through the data line DL.

Figure 4:
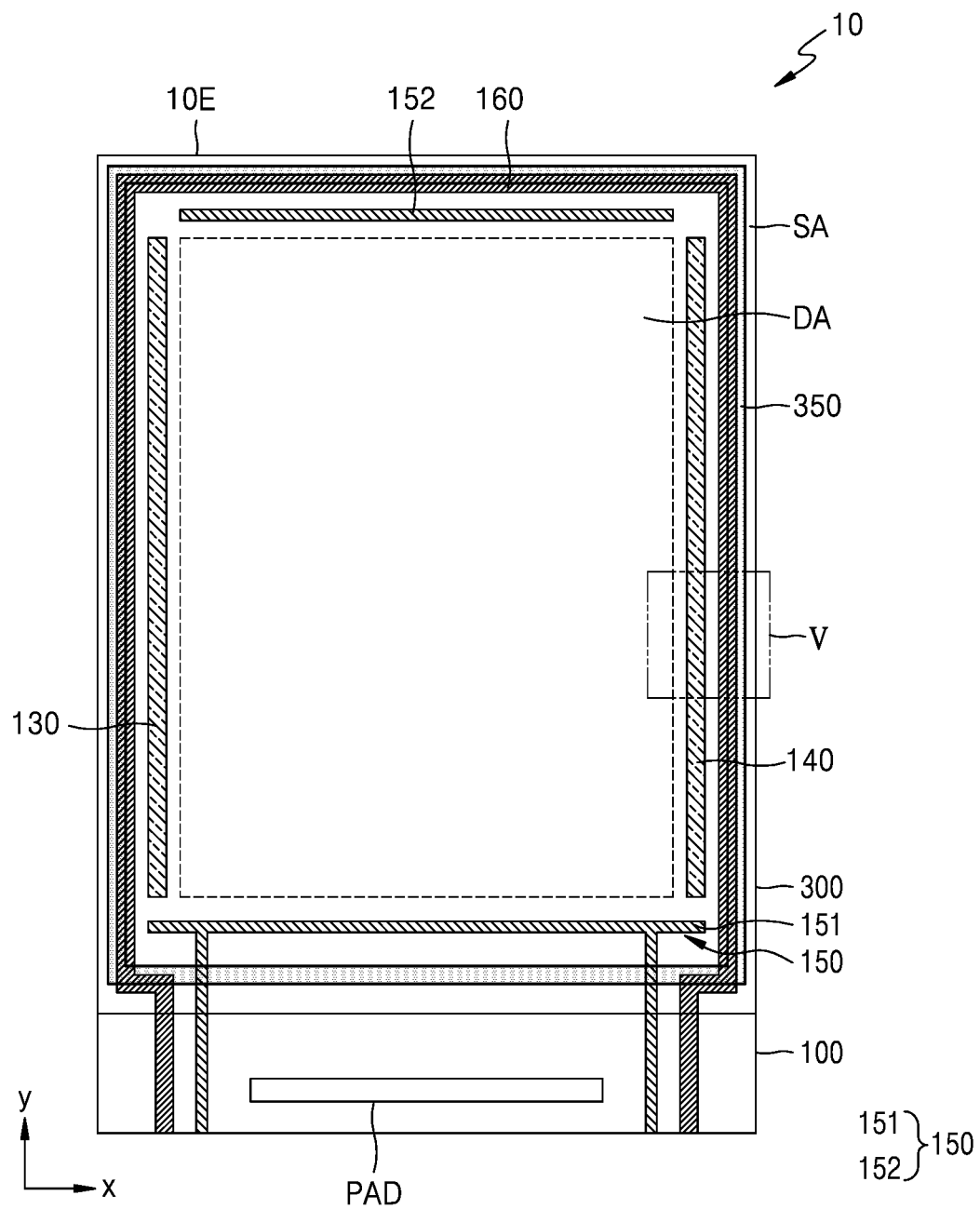
FIG. 4 is a schematic plan view of a display panel according to some embodiments, and illustrates an arrangement of a sealing member and a conductive layer included in the display panel.

FIG. 4 is a schematic plan view of a display panel according to some embodiments, and illustrates an arrangement of a sealing member and a conductive layer of the display panel.

Referring to FIG. 4, the sealing member 350 described with reference to FIG. 1 may partially overlap the second conductive layer 160 described with reference to FIG. 3.

Figure 5:
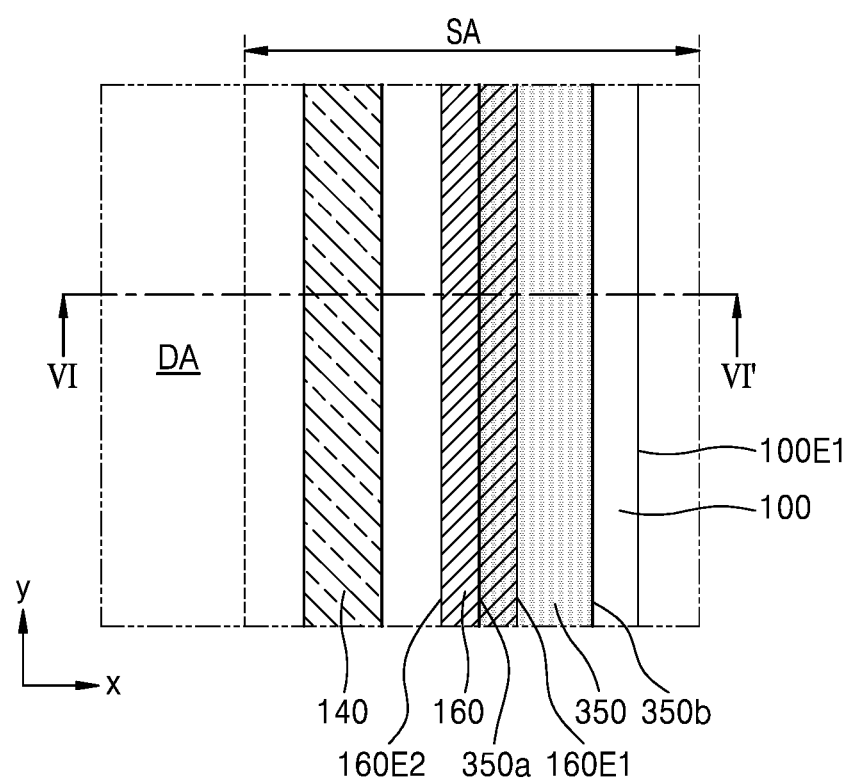
FIG. 5 is an enlarged plan view of a portion V of FIG. 4.

FIG. 5 is an enlarged plan view of the region V of FIG. 4.

Referring to FIG. 5, the first substrate 100 of the display panel 10 may include the display area DA and the surrounding area SA. The second driver 140, the second conductive layer 160, and the sealing member 350 may be arranged on the first substrate 100 in the surrounding area SA, and may extend along a first edge 100E1 of the first substrate 100.

The sealing member 350 may be arranged on an outer or outermost side of the first substrate 100. The term 'outer side' refers to a direction towards the first edge 100E1 from the center of the first substrate 100, and corresponds to an x direction of FIG. 5. An inner side denotes an opposite side of the outer side. The sealing member 350 may include an inner side surface 350a facing the display area DA, and an outer side surface 350b that is opposite to the inner side surface 350a. That is, the inner side surface 350a of the sealing member 350 may face an inner side of the first substrate 100, and the outer side surface 350b of the sealing member 350 may face the outer side of the first substrate 100. The outer side surface 350b of the sealing member 350 may be spaced apart from the first edge 100E1 of the first substrate 100 toward the display area DA. Alternatively, the outer side surface 350b of the sealing member 350 may form a continuous surface with the first edge 100E1 of the first substrate 100.

The second conductive layer 160 may be located on the first substrate 100 closer to the inner side than the sealing member 350. The second conductive layer 160 may overlap at least a portion of the sealing member 350. A first edge 160E1 of the second conductive layer 160 may be located between the inner side surface 350a and the outer side surface 350b of the sealing member 350, on a plane/in a plan view. A second edge 160E2 of the second conductive layer 160 may be closer to the display area DA than the first edge 160E1, and the inner side surface 350a of the sealing member 350 may be located between the first edge 160E1 and the second edge 160E2 of the second conductive layer 160 in a plan view.

The second driver 140 may be located on the first substrate 100 closer to the display area DA than the second conductive layer 160. The display area DA may be located on the first substrate 100 further from the outer side than the second driver 140, and thus may be surrounded by the surrounding area SA.

Figure 6A:
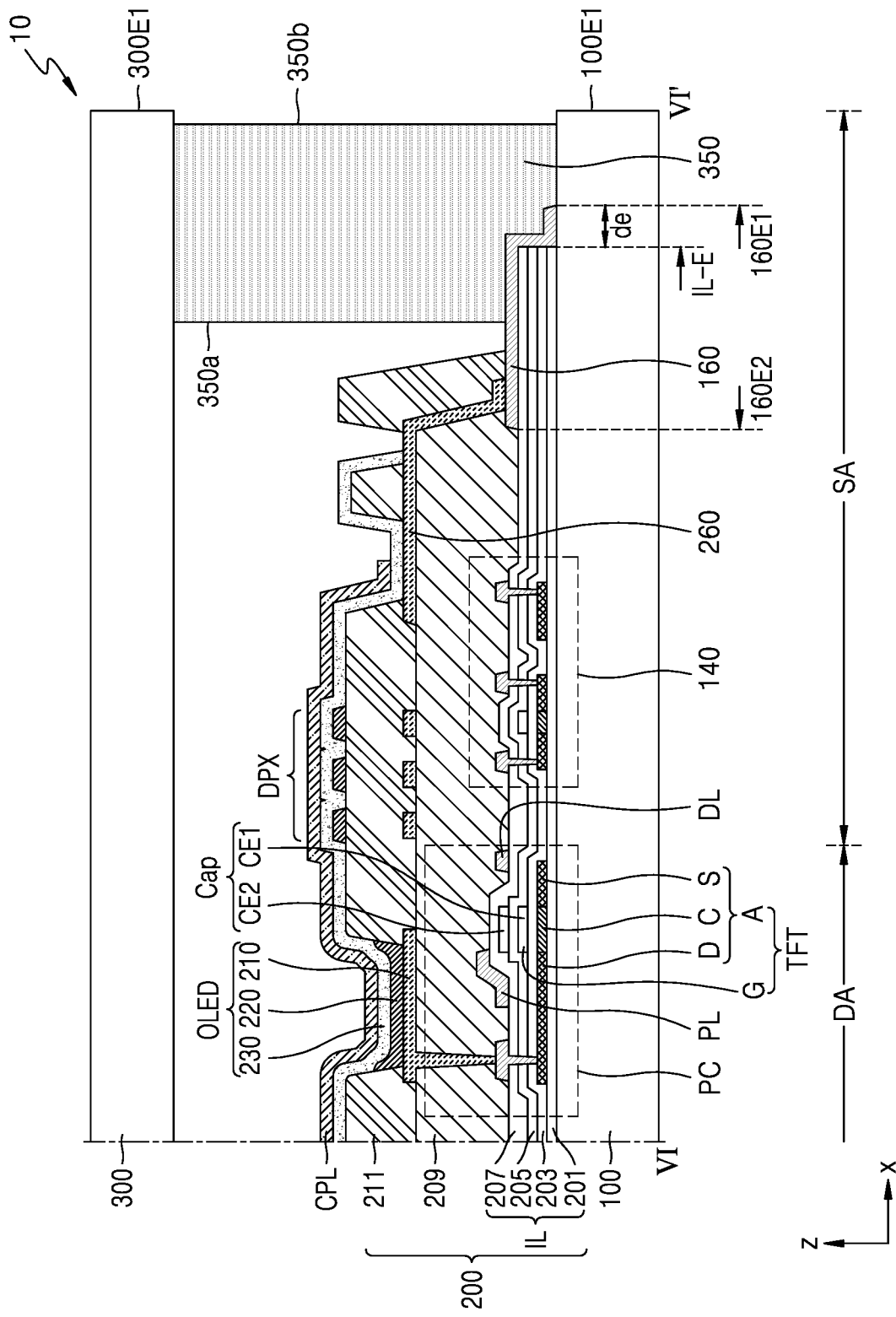
FIGS. 6A and 6B are cross-sectional views of a display panel taken along the line VI-VI' of FIG. 5.
Figure 6B:
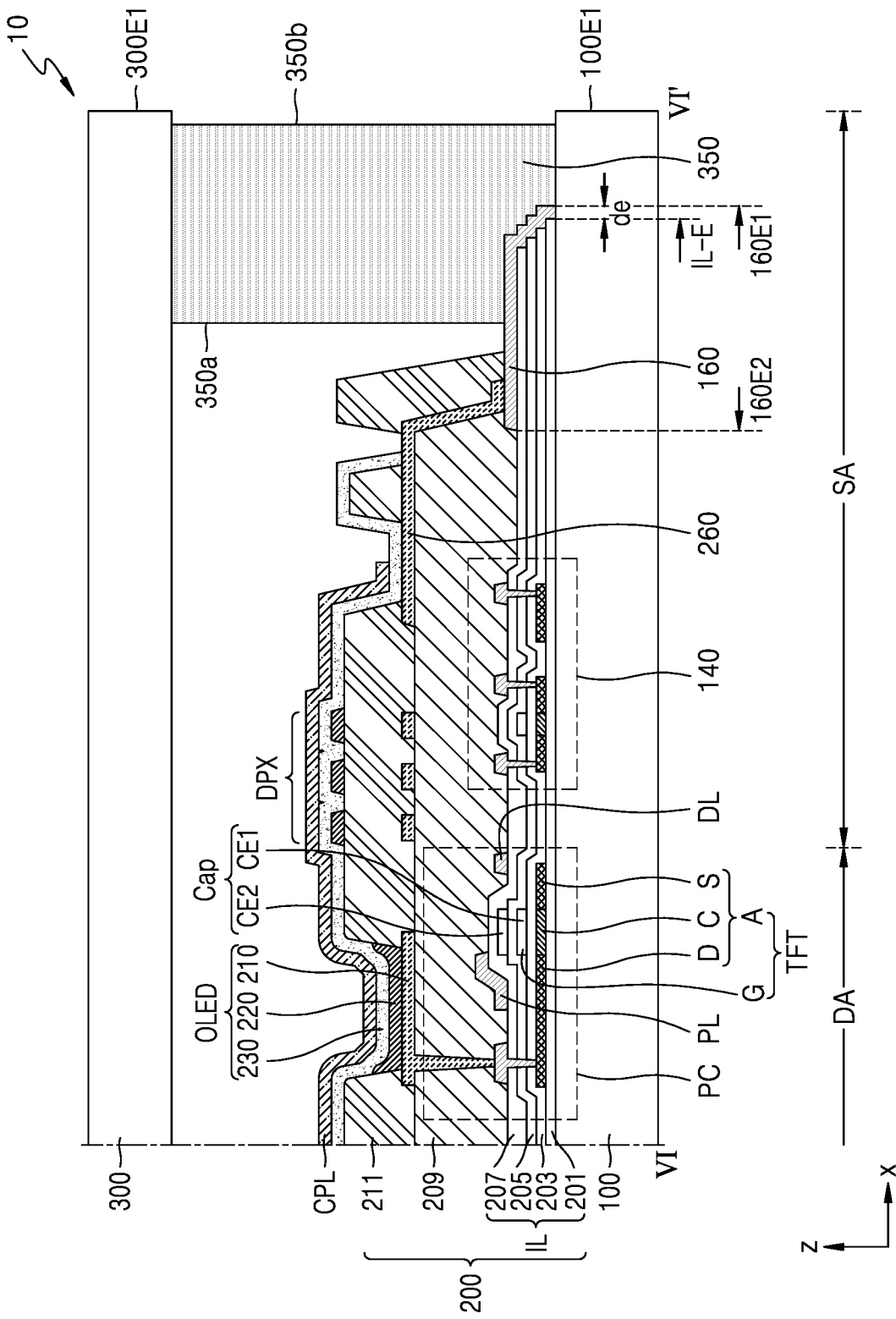

FIGS. 6A and 6B are cross-sectional views of a display panel taken along the line VI-VI' of FIG. 5. FIG. 6A is a cross-sectional view of a display panel according to some embodiments, and illustrates a display area and a surrounding area.

Referring to the display area DA of FIG. 6A, a display layer 200 is located on the first substrate 100. The display layer 200 may include the pixel circuit PC and the organic light-emitting diode OLED connected thereto. The pixel circuit PC may include a thin film transistor TFT and the storage capacitor Cap.

The first substrate 100 may be a transparent insulating substrate that includes glass, quartz, or the like, and may have a single-layer structure. The first substrate 100 may include $SiO_2$. The second substrate 300 may be a transparent insulating substrate that includes the same material as the first substrate 100.

A buffer layer 201 is located on the first substrate 100. The buffer layer 201 may reduce or prevent the penetration of foreign materials, moisture, or external air from a bottom portion of the first substrate 100, and may provide a flat surface on the first substrate 100. The buffer layer 201 may include an inorganic material such as silicon oxide (SiOx), silicon nitride ($SiN_X$), or silicon oxynitride (SiON), an organic material, or a composite of organic/inorganic materials, and may have a single-layer structure or a multilayered structure.

On the buffer layer 201, the thin film transistor TFT of the pixel PX may be located. The thin film transistor TFT may include a semiconductor layer A and a gate electrode G.

The semiconductor layer A may be on the buffer layer 201 and may include polysilicon. In other embodiments, the semiconductor layer A may include amorphous silicon. In other embodiments, the semiconductor layer A may include at least one oxide selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The semiconductor layer A may include a channel area C, and may include a source area S and a drain area D that are doped with impurities. The source area S and the drain area D may correspond to a source electrode and a drain electrode, respectively.

The gate electrode G may be located on the semiconductor layer A. The gate electrode G may include a conductive material such as molybdenum (Mo), aluminum (Al), copper (Cu), or titanium (Ti), and may have a single-layer structure or a multilayered structure including the aforementioned material. In some embodiments, the gate electrode G may be a metal layer including Mo.

A first gate insulating layer 203 may be located between the semiconductor layer A and the gate electrode G. The first gate insulating layer 203 may include an inorganic insulating material such as $SiO_x$, $SiN_X$, SiON, aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 203 may have a single-layer structure or a multilayered structure including the aforementioned inorganic insulating material.

The storage capacitor Cap may include a first electrode CE1 and a second electrode CE2 that overlap each other.

The second electrode CE2 may include Al, platinum (Pt), palladium (Pd), silver (Ag), magnesium (Mg), gold (Au), nickel (Ni), neodymium (Nd), iridium (Ir), Cr, lithium (Li), calcium (Ca), Mo, titanium (Ti), tungsten (W) and/or Cu and may have a single-layer structure or a multilayered structure including the aforementioned material. In some embodiments, the second electrode CE2 may be a metal layer including Mo.

FIG. 6A illustrates that the storage capacitor Cap overlaps the thin film transistor TFT, and that the first electrode CE1 is also the gate electrode G of the thin film transistor TFT, but other embodiments are not limited thereto. In other embodiments, the storage capacitor Cap may not overlap the thin film transistor TFT, and the first electrode CE1 may be separated from the gate electrode G of the thin film transistor TFT.

A second gate insulating layer 205 may be located between the first electrode CE1 and the second electrode CE2. The second gate insulating layer 205 may include an inorganic insulating material such as $SiO_2$, $SiN_X$, SiON, $Al_2O_3$, $TiO_2$, $Ta_2O_5$, $HfO_2$, or $ZnO_2$, and may have a single-layer structure or a multilayered structure including the aforementioned material.

An interlayer insulating layer 207 may be located on the second electrode CE2 of the storage capacitor Cap. The interlayer insulating layer 207 may include an inorganic insulating material such as $SiO_2$, $SiN_X$, SiON, $Al_2O_3$, $TiO_2$, $Ta_2O_5$, $HfO_2$, or $ZnO_2$, and may have a single-layer structure or a multilayered structure including the aforementioned material.

On the interlayer insulating layer 207, the data line DL and the driving power line PL may be located. The data line DL and the driving power line PL may each include a conductive material such as Mo, Al, Cu, or Ti, and may have a single-layer structure or a multilayered structure including the aforementioned material. In some embodiments, the data line DL and the driving power line PL may have a Ti/Al/Ti structure in which a Ti layer, an Al layer, and another Ti layer are sequentially stacked.

A planarization insulating layer 209 may be located on the data line DL and the driving power line PL. The planarization insulating layer 209 may have a flat upper surface so that the pixel electrode 210, which is located on the upper portion of the planarization insulating layer 209, may be flat. The planarization insulating layer 209 may be a layer or layers including an organic material or an inorganic material. The planarization insulating layer 209 may include an organic insulating material. The planarization insulating layer 209 may include a general-purpose polymer, such as benzocyclobutene (BCB), PI, hexamethyldisiloxane (HMDSO), polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a blend thereof. The planarization insulating layer 209 may include $SiO_2$, $SiN_x$, SiON, $Al_2O_3$, $TiO_2$, $Ta_2O_5$, $HfO_2$, $ZnO_2$, or the like. After the planarization insulating layer 209 is formed, chemical mechanical polishing may be performed to provide a flat upper surface.

The pixel electrode 210 may be located on the planarization insulating layer 209. The pixel electrode 210 may contact a source electrode or a drain electrode through a contact hole penetrating the planarization insulating layer 209, and may be electrically connected to the thin film transistor TFT of the pixel circuit PC.

The pixel electrode 210 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In other embodiments, the pixel electrode 210 may include a reflection layer including Ag, Mg, Al, Pt, Pd, Au, Ni, Nd, Ir, Cr, or a compound thereof. In other embodiments, the pixel electrode 210 may further include a layer including ITO, IZO, ZnO, or $In_2O_3$ on and/or under the above-described reflection layer. In some embodiments, the pixel electrode 210 may have a structure of ITO/Ag/ITO.

A pixel-defining layer 211 may cover an edge of the pixel electrode 210. The pixel-defining layer 211 may overlap the pixel electrode 210 and may include an opening that defines an emission area of a pixel. The pixel-defining layer 211 may reduce or prevent the likelihood of arcs, etc. from being generated at edges of the pixel electrode 210 by increasing a distance between the edges of the pixel electrode 210 and an opposite electrode 230 above an upper portion of the pixel electrode 210. The pixel-defining layer 211 may include an organic insulating material such as polyimide, polyamide, acryl resin, BCB, HMDSO, and phenol resin and may be formed by using spin coating, etc.

An intermediate layer 220 is located on the pixel-defining layer 211 to correspond to the pixel electrode 210. The intermediate layer 220 may include a polymer material or a low-molecular weight material, and may emit, for example, red, green, or blue light.

The opposite electrode 230 is located on the intermediate layer 220. The opposite electrode 230 may include a conductive material having a small work function. For example, the opposite electrode 230 may include a transparent (translucent) layer including Ag, Mg, Al, Pt, Pd, Au, Ni, Nd, Ir, Cr, Li, Ca, or an alloy thereof. Alternatively, the opposite electrode 230 may further include a layer including ITO, IZO, ZnO, or $In_2O_3$ on the transparent (translucent) layer including the aforementioned material.

The pixel electrode 210, the intermediate layer 220, and the opposite electrode 230 may form the organic light-emitting diode OLED.

A capping layer CPL may be formed on the opposite electrode 230. The capping layer CPL may include an inorganic insulating material such as LiF or $SiN_X$ and/or an organic insulating material. In some embodiments, the capping layer CPL may not be formed.

Referring to the surrounding area SA of FIG. 6A, the second driver 140 may be located in the surrounding area SA that is adjacent to the display area DA. The second driver 140 may include a thin film transistor including a source electrode and a drain electrode.

In the surrounding area SA, the sealing member 350 is located between the first substrate 100 and the second substrate 300. A first surface of the first substrate 100 may face a first surface of the second substrate 300, and the sealing member 350 may be located therebetween. The first substrate 100 includes a second surface, which is opposite to the first surface, and the first edge 100E1 coupling the first surface and the second surface of the first substrate 100 to each other, and the first edge 100E1 corresponds to a side surface of the first substrate 100. The first edge 100E1 of the first substrate 100 may correspond to the first edge 10E1 of the display panel 10. As described above, the second substrate 300 includes a second surface, which is opposite to the first surface, and a first edge 300E1 coupling the first surface and the second surface of the second substrate 300 to each other, and the first edge 300E1 corresponds to a side surface of the second substrate 300. The first edge 100E1 of the first substrate 100 and the first edge 300E1 of the second substrate 300 may define the first edge 10E1 of the display panel 10 that is described above with reference to FIG. 1.

The outer side surface 350b of the sealing member 350 may not be on the same vertical line as the first edge 100E1 of the first substrate 100 and the first edge 300E1 of the second substrate 300. That is, the outer side surface 350b of the sealing member 350 may be on a plane that is different from a plane on which the first edge 100E1 of the first substrate 100 and the first edge 300E1 of the second substrate 300 are located. Alternatively, the outer side surface 350b of the sealing member 350 is continuously connected to the first edge 100E1 of the first substrate 100 and the first edge 300E1 of the second substrate 300 and thus forms one surface.

The sealing member 350 may include, for example, frit. The frit is a member including a glass material that becomes a raw material of glass and may be hardened after being exposed to laser beams. The frit may include about 15 to about 40 wt % of $V_2O_5$, about 10 to about 30 wt % of $TeO_2$, about 1 to about 15 wt % of $P_2O_5$, about 1 to about 15 wt % of BaO, about 1 to about 20 wt % of ZnO, about 5 to about 30 wt % of $ZrO_2$, about 5 to about 20 wt % of $WO_3$, and about 1 to about 15 wt % of BaO as main ingredients, and may include a composition containing at least one of $Fe_2O_3$, CuO, MnO, $Al_2O_3$, $Na_2O$, and $Nb_2O_5$ as additives. In other embodiments, the sealing member 350 may include $SiO_2$. In other embodiments, the sealing member 350 may include a material such as epoxy.

In the surrounding area SA, an insulating layer IL may include an edge IL-E. The insulating layer IL may include at least one inorganic insulating layer. For example, the insulating layer IL may include the buffer layer 201, the first gate insulating layer 203, the second gate insulating layer 205, and/or the interlayer insulating layer 207.

The insulating layer IL may include a first surface (a bottom surface) facing the first substrate 100 and a second surface (an upper surface) that is opposite to the first surface, and the edge IL-E of the insulating layer IL may correspond to a side surface that couples the first surface and the second surface of the insulating layer IL to each other.

The edge IL-E of the insulating layer IL may be closer to the display area DA than the first edge 100E1 of the first substrate 100. For example, the edge IL-E of the insulating layer IL may be located between the inner side surface 350a and the outer side surface 350b of the sealing member 350 in a plan view. In some embodiments, the sealing member 350 may have a width of between about 200 um and about 800 um, and a thickness of between about 2 um and about 10 um.

As the edge IL-E of the insulating layer IL is located between the inner side surface 350a and the outer side surface 350b of the sealing member 350 in a plan view, the insulating layer IL may not directly contact, or may not be exposed to, the outside because of the sealing member 350. Also, the insulating layer IL may partially overlap the sealing member 350, and the sealing member 350 may directly contact the first substrate 100 in a portion of the surrounding area SA where the insulating layer IL is not located.

As a comparative example, when the edge IL-E of the insulating layer IL is on the same plane as the outer side surface 350b of the sealing member 350, or as the first edge 100E1 of the first substrate 100, the side surface of the insulating layer IL may be exposed to the outside, and the sealing member 350 may directly contact only the insulating layer IL, instead of contacting the first substrate 100. When external static electricity is applied to a display panel having the aforesaid structure, the applied external static electricity may directly affect the insulating layer IL. When static electricity is applied to the insulating layer IL having a relatively small thickness, heat may be generated, and the insulating layer IL may be damaged accordingly. When the insulating layer IL is damaged by external static electricity, the insulating layer IL may be exfoliated from the first substrate 100, and the sealing member 350 may also be separated from the first substrate 100 or the insulating layer IL. Thus, a display panel may have defects.

However, according to one or more embodiments, because the edge IL-E of the insulating layer IL is closer to the display area DA than the outer side surface 350b of the sealing member 350, damage to the insulating layer IL due to external static electricity may be prevented or reduced.

The sealing member 350 may contact the first substrate 100 instead of the insulating layer IL, and thus, a structural strength of the display panel may be improved. For example, a portion of the sealing member 350 that includes the outer side surface 350b may directly contact an upper surface of the first substrate 100. In some embodiments, the sealing member 350 may include the same material as the first substrate 100, and the sealing member 350 and the first substrate 100 may commonly include $SiO_2$. When the sealing member 350 directly contacts the first substrate 100 that includes the same material as the sealing member 350, adhesion between the sealing member 350 and the first substrate 100 may increase. An upper surface of the sealing member 350 may directly contact the second substrate 300.

A conductive layer may be located under the sealing member 350, for example, between the first substrate 100 and the sealing member 350. FIG. 6A illustrates the second conductive layer 160 that partially overlaps the sealing member 350 thereunder. A portion of the second conductive layer 160 may be located on the insulating layer IL.

The second conductive layer 160 may be a power supply line through which power is applied to the pixels PX arranged in the display area DA. As illustrated in FIG. 6A, the second conductive layer 160 may be on the same layer (e.g., the interlayer insulating layer 207) as the data line DL or the driving power line PL, and may be electrically connected to the opposite electrode 230 with a connection electrode layer 260 therebetween. The opposite electrode 230 may extend past dummy pixels DPX and contact the connection electrode layer 260, and the connection electrode layer 260 may extend towards the sealing member 350 and contact the second conductive layer 160. The second conductive layer 160 may be configured to deliver, to the opposite electrode 230, the common voltage ELVSS described above with reference to FIG. 2.

The second conductive layer 160 may be a metal layer and may include the same material as the data line DL or the driving power line PL. Also, the second conductive layer 160 may include the same material as the source electrode or the drain electrode of the thin film transistor, and may secure mechanical strength of the display panel 10.

At least a portion of the second conductive layer 160 may overlap the sealing member 350. The first edge 160E1 of the second conductive layer 160 may be located between the inner side surface 350a and the outer side surface 350b of the sealing member 350 in a plan view. By arranging the second conductive layer 160 to overlap the sealing member 350, an area of a portion of the entire area of the display area where no images are provided (e.g., a dead space), may decrease.

Referring to FIG. 6A, the second conductive layer 160 may cover the side surface corresponding to the edge IL-E of the insulating layer IL. Although external static electricity is applied to the display panel, the second conductive layer 160 covers the side surface of the insulating layer IL, and thus, the likelihood of damage to the insulating layer IL due to static electricity may be prevented or reduced.

The first edge 160E1 of the second conductive layer 160 may extend towards the first edge 100E1 of the first substrate 100 past the edge IL-E of the insulating layer IL. Because the second conductive layer 160 may receive a certain voltage (e.g., the common voltage ELVSS of FIG. 2), damage to a neighboring structure or layer (e.g., the insulating layer IL) due the static electricity may be prevented or reduced.

In some embodiments, a distance which the first edge 160E1 of the second conductive layer 160 extends past the edge IL-E of the insulating layer IL, that is, a distance "de" between the first edge 160E1 of the second conductive layer 160 and the edge IL-E of the insulating layer IL (e.g., in a plan view), may be about 10 μm, about 30 μm, about 80 μm, or about 130 μm. Also, in some embodiments, a ratio of the distance de to the width of the sealing member 350 may be between about 0.0125 and about 0.65.

FIG. 6B is a cross-sectional view of a display panel according to other embodiments, and illustrates a display area and a surrounding area. Configurations, with the exception of configurations regarding the edge IL-E of the insulating layer IL and the second conductive layer 160 of FIG. 6B, are the same as those described with reference to FIG. 6A, and thus, a difference between the configurations of FIGS. 6A and 6B will be mainly described.

Referring to FIG. 6B, sub-layers forming the insulating layer IL, that is, the buffer layer 201, the first gate insulating layer 203, the second gate insulating layer 205, and the interlayer insulating layer 207, may form one or more step differences. Such a step difference may be formed according to an order of processes and according to a method of forming each sub-layer of the insulating layer IL.

When the sub-layers of the insulating layer IL form the step difference, an edge of a sub-layer, which is the closest to the outer side surface 350b of the sealing member 350 from among edges of the sub-layers of the insulating layer IL, may be defined as the edge IL-E of the insulating layer IL. In some embodiments, and referring to FIG. 6B, an edge of the buffer layer 201 corresponds to the edge IL-E of the insulating layer IL.

The second conductive layer 160 may cover the side surface of the insulating layer IL that corresponds to the edge IL-E of the insulating layer IL. That is, the second conductive layer 160 may cover all edges of the sub-layers of the insulating layer IL. Although not illustrated in FIG.

6B, the second conductive layer 160 may extend towards an edge of the first substrate 100 past the edge IL-E of the insulating layer IL.

According to the one or more embodiments, a display panel that is less damaged by static electricity, etc. and that has improved structural strength may be realized. However, the scope of the present disclosure is not limited by the aforementioned effects. Although the description has been made with repeated reference to the first edge (100E1) of the first substrate (100) and its surrounding configuration, the above descriptions can be equally or similarly applied to the second to fourth edges (100E2, 100E3, 100E4) of the first substrate (100) and its surrounding configuration, respectively.

It should be understood that embodiments described herein should be considered in a descriptive sense only and not for purposes of limitation. Descriptions of features or aspects within the embodiments should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display panel comprising:
   a first substrate;
   pixels arranged on the first substrate and configured to define a display area;
   a thin film transistor (TFT) between the first substrate and the pixels, the TFT being electrically connected to one of the pixels and comprising a semiconductor layer and a gate electrode;
   a second substrate facing the first substrate;
   an insulating layer comprising a buffer layer between the first substrate and the semiconductor layer and a gate insulating layer between the semiconductor layer and the gate electrode;
   a conductive layer on the insulating layer; and
   a sealing member between the first substrate and the second substrate and surrounding the display area, and comprising an inner side surface facing the display area, and an outer side surface that is opposite to the inner side surface,
   wherein an edge of the insulating layer and an edge of the conductive layer are between the inner side surface and the outer side surface of the sealing member in a plan view, such that a portion of the sealing member adjacent the outer side surface directly contacts the first substrate at the edge of the conductive layer at which the conductive layer directly contacts the first substrate.

2. The display panel of claim 1, wherein at least a portion of the conductive layer overlaps the sealing member in plan view.

3. The display panel of claim 2, wherein a portion of the conductive layer directly contacts the sealing member.

4. The display panel of claim 1, wherein each of the pixels comprises:
   a pixel electrode;
   an emission layer on the pixel electrode; and
   an opposite electrode on the emission layer and electrically connected to the conductive layer.

5. The display panel of claim 1, wherein the sealing member comprises $SiO_2$.

6. The display panel of claim 1, wherein the insulating layer comprises an inorganic insulating layer.

7. The display panel of claim 1, wherein the conductive layer covers a side surface corresponding to the edge of the insulating layer.

8. The display panel of claim 7, wherein the conductive layer extends towards the edge of the first substrate past the edge of the insulating layer.

9. The display panel of claim 1, wherein the insulating layer comprises sub-layers forming a step difference.

10. The display panel of claim 1, further comprising a storage capacitor comprising a first electrode, a second electrode, and a sub-layer between the first electrode and the second electrode, the first electrode being the gate electrode,
    wherein the insulating layer further comprises the sub-layer on the gate electrode.

11. A display panel comprising:
    a first substrate;
    pixels arranged on the first substrate, defining a display area, and each comprising a pixel electrode, an emission layer, and an opposite electrode;
    a thin film transistor (TFT) between the first substrate and the pixels, the TFT being electrically connected to one of the pixels and comprising a semiconductor layer and a gate electrode;
    a second substrate facing the first substrate;
    an insulating layer comprising a buffer layer between the first substrate and the semiconductor layer and a gate insulating layer between the semiconductor layer and the gate electrode;
    a conductive layer on the insulating layer, and electrically connected to the opposite electrode; and
    a sealing member between the first substrate and the second substrate, surrounding the display area, and comprising an inner side surface facing the display area, and an outer side surface that is opposite to the inner side surface,
    wherein an edge of the insulating layer and an edge of the conductive layer are between the inner side surface and the outer side surface of the sealing member in a plan view, such that a portion of the sealing member adjacent the outer side surface directly contacts the first substrate at the edge of the conductive layer at which the conductive layer directly contacts the first substrate.

12. The display panel of claim 11, wherein the sealing member comprises $SiO_2$.

13. The display panel of claim 11, wherein the insulating layer comprises an inorganic insulating layer.

14. The display panel of claim 11, wherein the conductive layer covers a side surface corresponding to the edge of the insulating layer.

15. The display panel of claim 11, wherein the conductive layer extends towards an edge of the first substrate past the edge of the insulating layer.

16. The display panel of claim 11, wherein the insulating layer comprises sub-layers forming a step difference.

17. The display panel of claim 11, further comprising a storage capacitor comprising a first electrode, a second electrode, and a sub-layer between the first electrode and the second electrode, the first electrode being the gate electrode,
    wherein the insulating layer further comprises the sub-layer on the gate electrode.

* * * * *